US010014420B2

(12) United States Patent
Shigematsu et al.

(10) Patent No.: US 10,014,420 B2
(45) Date of Patent: Jul. 3, 2018

(54) SOLAR CELL (71) Applicant: Panasonic Intellectual Property Management Co., Ltd., Osaka (JP)

(72) Inventors: Masato Shigematsu, Osaka (JP); Naofumi Hayashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/220,394

(22) Filed: Jul. 27, 2016

(65) Prior Publication Data
US 2016/0336464 A1 Nov. 17, 2016

Related U.S. Application Data (63) Continuation of application No. PCT/JP2015/052006, filed on Jan. 26, 2015.

(30) Foreign Application Priority Data

Jan. 29, 2014 (JP) ................................ 2014-014603

(51) Int. Cl.
*H01L 31/00* (2006.01)
*H01L 31/0224* (2006.01)
(Continued)

(52) U.S. Cl.
CPC .. *H01L 31/022441* (2013.01); *H01L 31/0747* (2013.01); *H01L 31/1804* (2013.01);
(Continued)

(58) Field of Classification Search
CPC ............. H01L 31/022441; H01L 31/20; H01L 31/0747; H01L 31/0224; H01L 31/075; Y02E 10/50
See application file for complete search history.

(56) References Cited

U.S. PATENT DOCUMENTS

2013/0137211 A1\* 5/2013 Mishima ........... H01L 31/02167
438/98
2014/0096819 A1 4/2014 Kirkengen et al.

FOREIGN PATENT DOCUMENTS

JP WO 03083955 A1 \* 10/2003 ..... H01L 31/022441
JP 2012-28718 A 2/2012
(Continued)

OTHER PUBLICATIONS

International Search Report (ISR) dated Mar. 10, 2015 on PCT Application No. PCT/JP2015/052006.

*Primary Examiner* — Angelo Trivisonno
(74) *Attorney, Agent, or Firm* — Metrolexis Law Group, PLLC (57) ABSTRACT A solar cell includes: a semiconductor substrate having a light-receiving surface and a back surface; a first-conductivity-type first semiconductor layer on the back surface; a second-conductivity-type second semiconductor layer on the back surface; a first electrode electrically connected to the first semiconductor layer; a second electrode electrically connected to the second semiconductor layer; and an insulating layer in a boundary region between a first-conductivity-type region of the first semiconductor layer and a second-conductivity-type region of the second semiconductor layer. The insulating layer has an inclined side surface adjacent the second-conductivity-type region inclined such that the thickness of the insulating layer decreases with decreasing distance from the second-conductivity-type region. The width of the inclined surface in a direction perpendicular to the thickness direction of the insulating layer and toward the second-conductivity-type region is 10 to 300 times the thickness of the insulating layer in a region excluding the inclined surface.

4 Claims, 7 Drawing Sheets (51) Int. Cl.
  *H01L 31/0747* (2012.01)
  *H01L 31/20* (2006.01)
  *H01L 31/18* (2006.01)
  *H01L 31/075* (2012.01)

(52) U.S. Cl.
  CPC ............ *H01L 31/20* (2013.01); *H01L 31/075* (2013.01); *Y02E 10/547* (2013.01); *Y02P 70/521* (2015.11)

(56) References Cited

FOREIGN PATENT DOCUMENTS

| | | | |
|---|---|---|---|
| JP | WO 2012014960 A1 * | 2/2012 | ....... H01L 31/02167 |
| JP | 2013-120863 A | 6/2013 | |
| JP | 2013-197555 A | 9/2013 | |
| WO | 2012-132655 A1 | 10/2012 | |
| WO | 2012-163517 A2 | 12/2012 | |
| WO | WO 2012163517 A2 * | 12/2012 | ..... H01L 31/022441 |

\* cited by examiner

SOLAR CELL

CROSS REFERENCE TO RELATED APPLICATIONS

This application is a U.S. continuation application of PCT International Patent Application Number PCT/JP2015/052006 filed on Jan. 26, 2015, claiming the benefit of priority of Japanese Patent Application Number 2014-014603 filed on Jan. 29, 2014, the entire contents of which are hereby incorporated by reference.

TECHNICAL FIELD

The present disclosure relates to a solar cell.

BACKGROUND ART

A back contact solar cell in which an n-type semiconductor layer and a p-type semiconductor layer are formed on the back surface of a semiconductor substrate is known (for example, see Japanese Unexamined Patent Application Publication No. 2012-28718). In a back contact solar cell, an insulating layer is generally provided in a boundary region between the n-type semiconductor layer and the p-type semiconductor layer. The n-side electrode connected to the n-type semiconductor layer and the p-side electrode connected to the p-type semiconductor layer may be formed above the insulating layer as well.

SUMMARY

However, when at least part of the n-side electrode or the p-side electrode is formed by, for example, sputtering or chemical vapor deposition (CVD), there is a problem that the electrode may sever or detach from the surface at a stepped portion defined by the side surface of the insulating layer.

One object of the present disclosure is to provide a solar cell that can prevent or reduce severance or detachment of an electrode caused by the insulating layer.

According to one aspect of the present disclosure, a solar cell includes: a semiconductor substrate of one of a first conductivity type and a second conductivity type having a light receiving surface and a back surface; a first semiconductor layer of the first conductivity type on the back surface; a second semiconductor layer of the second conductivity type on the back surface; a first electrode electrically connected to the first semiconductor layer; a second electrode electrically connected to the second semiconductor layer; and an insulating layer in a boundary region between a first conductivity type region of the first semiconductor layer and a second conductivity type region of the second semiconductor layer. The side of the insulating layer adjacent the second conductivity type region has an inclined surface inclined such that the thickness of the insulating layer decreases with decreasing distance from the second conductivity type region. The width of the inclined surface in a direction perpendicular to the thickness direction of the insulating layer and toward the second conductivity type region is 10 to 300 times the thickness of the insulating layer in the region excluding the inclined surface.

Accordingly, severance or detachment of an electrode caused by the insulating layer can be prevented or reduced.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

The following describes an embodiment. The embodiment is purely illustrative, and is not intended to limit the scope of the present disclosure. In the drawings, elements having essentially the same function may share like reference numbers.

Figure 1:
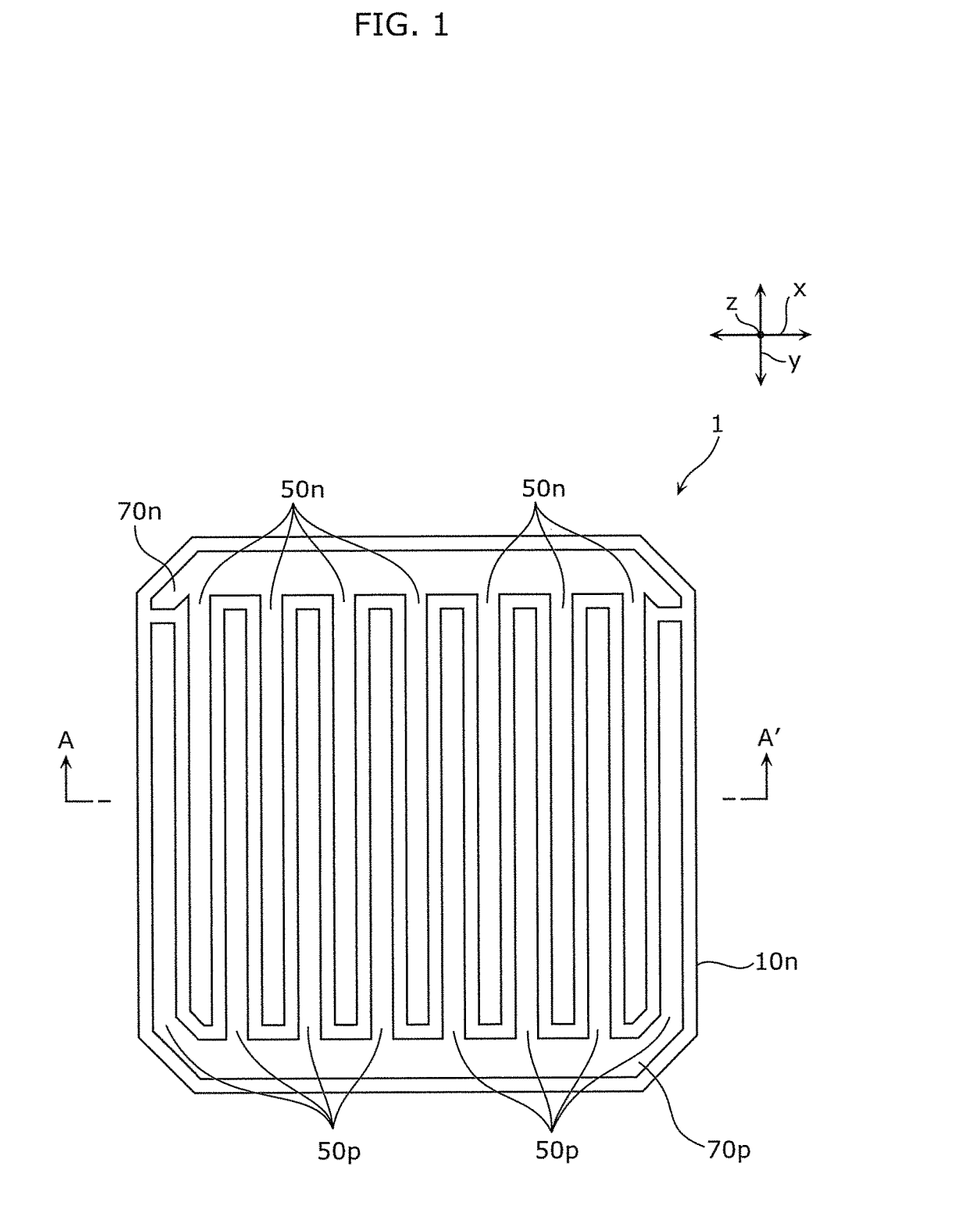
FIG. 1 is a plan view of the back of a solar cell according to an embodiment.
Figure 2:
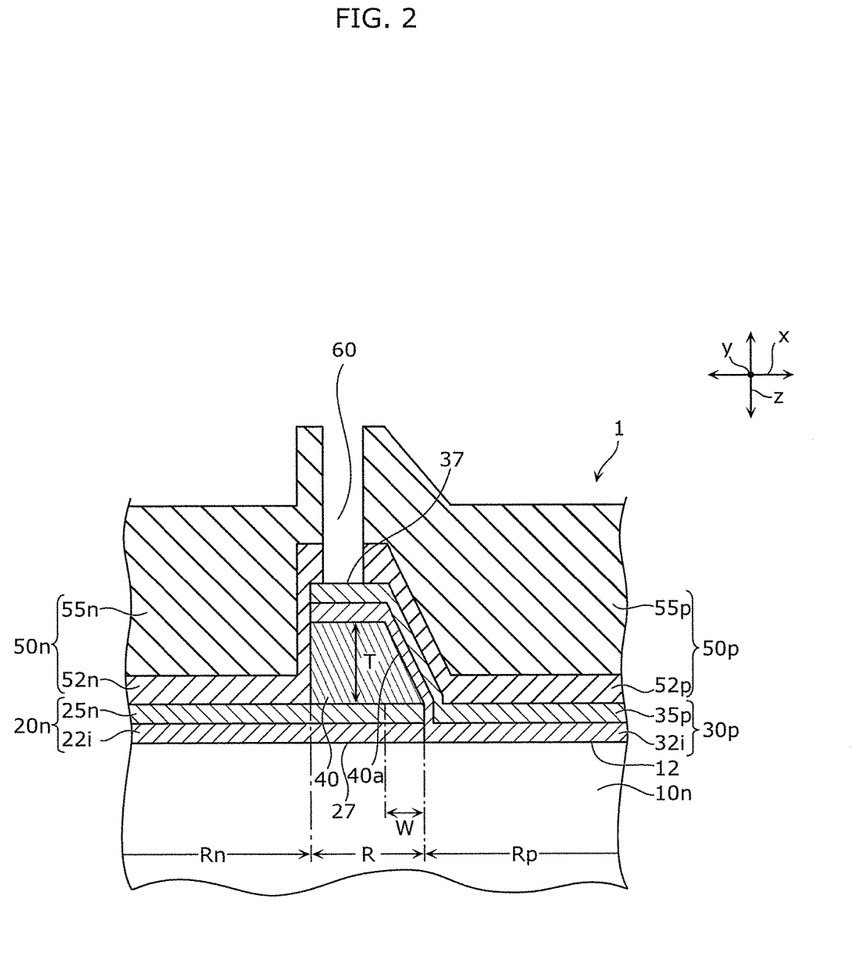
FIG. 2 is a cross sectional view of a solar cell according to an embodiment taken along line A-A' in FIG. 1.

FIG. 1 is a plan view of the back of a solar cell according to the embodiment. FIG. 2 is a cross sectional view of the solar cell according to the embodiment taken along line A-A' in FIG. 1. As illustrated in FIG. 1 and FIG. 2, the solar cell 1 includes a semiconductor substrate 10n, a first semiconductor layer 20n, a second semiconductor layer 30p, an insulating layer 40, a first electrode 50n, a second electrode 50p, a connecting electrode 70n, and a connecting electrode 70p.

The semiconductor substrate 10n has a light receiving surface that receives light on one side, and a back surface 12 on the reverse side. The semiconductor substrate 10n generates carriers (electrons and electron holes) upon the light receiving surface receiving light.

The semiconductor substrate 10n has an n-type or p-type electrical conductivity, and may be made of a crystalline semiconductor such as a monocrystalline or polycrystalline silicon, or a common semiconductor including a compound semiconductor such as GaAs, InP, etc. The light receiving surface and the back surface 12 of semiconductor substrate 10n are finely textured. Although not illustrated in the drawings, no light-blocking structure (such as an electrode) is provided on the light receiving surface of the semiconductor substrate 10n. As such, the semiconductor substrate 10n is capable of receiving light across the entire light receiving surface. Note that the light receiving surface may be covered with a passivation layer. A passivation layer has passivating characteristics which reduce carrier recombination. A passivation layer may include a substantially intrinsic amorphous semiconductor layer formed without adding a dopant or by adding a small amount of a dopant.

The semiconductor substrate 10n is a first conductivity type or second conductivity type semiconductor substrate. In this embodiment, the semiconductor substrate 10n is exemplified as a first conductivity type semiconductor substrate. The semiconductor substrate 10n is also exemplified as an n-type monocrystalline silicon substrate. Therefore, in this embodiment, the first conductivity type is n-type.

The first semiconductor layer 20n is formed on the back surface 12 of the semiconductor substrate 10n. The long direction of the first semiconductor layer 20n corresponds with the y-direction. Like the semiconductor substrate 10n, the first semiconductor layer 20n is also a first conductivity type semiconductor layer. The first semiconductor layer 20n is an n-type amorphous semiconductor layer. With this, carrier recombination at the interface between the back surface 12 of the semiconductor substrate 10n and the first semiconductor layer 20n can be reduced.

The second semiconductor layer 30p is formed on the back surface 12 of the semiconductor substrate 10n. The long direction of the second semiconductor layer 30p corresponds with the y-direction. Unlike the semiconductor substrate 10n, the second semiconductor layer 30p is a second conductivity type semiconductor layer. The second semiconductor layer 30p is a p-type amorphous semiconductor layer. Thus, the junction between the semiconductor substrate 10n and the second semiconductor layer 30p is a p-n junction. The second semiconductor layer 30p is also formed on the insulating layer 40.

In this embodiment, as illustrated in FIG. 2, the first semiconductor layer 20n includes an i-type amorphous semiconductor layer 22i and an n-type amorphous semiconductor layer 25n. The i-type amorphous semiconductor layer 22i is formed on the back surface 12 of the semiconductor substrate 10n. The n-type amorphous semiconductor layer 25n is formed on the i-type amorphous semiconductor layer 22i. With such a stacked structure of the n-type semiconductor substrate 10n, the i-type amorphous semiconductor layer 22i, and the n-type amorphous semiconductor layer 25n, it is possible to further reduce carrier recombination at the back surface of the semiconductor substrate 10n.

In this embodiment, as illustrated in FIG. 2, the second semiconductor layer 30p includes an i-type amorphous semiconductor layer 32i and a p-type amorphous semiconductor layer 35p. The i-type amorphous semiconductor layer 32i is formed on the back surface 12 of the semiconductor substrate 10n. The p-type amorphous semiconductor layer 35p is formed on the i-type amorphous semiconductor layer 32i. With such a stacked structure of the n-type semiconductor substrate 10n, the i-type amorphous semiconductor layer 32i, and the p-type amorphous semiconductor layer 35p, it is possible to improve p-n junction characteristics.

The i-type amorphous semiconductor layer 22i, the i-type amorphous semiconductor layer 32i, the n-type amorphous semiconductor layer 25n, and the p-type amorphous semiconductor layer 35p may each be made of an amorphous semiconductor including hydrogen. Examples of such an amorphous semiconductor include amorphous silicon, amorphous silicon carbide, and amorphous silicon germanium. Note that the amorphous semiconductor layer is not limited to this example; other amorphous semiconductor layers may be used. The i-type amorphous semiconductor layer 22i, the i-type amorphous semiconductor layer 32i, the n-type amorphous semiconductor layer 25n, and the p-type amorphous semiconductor layer 35p may each be made of only one type of amorphous semiconductor. The i-type amorphous semiconductor layer 22i, the i-type amorphous semiconductor layer 32i, the n-type amorphous semiconductor layer 25n, and the p-type amorphous semiconductor layer 35p may each include a combination of two or more types of amorphous semiconductors.

As illustrated in FIG. 1 and FIG. 2, the first semiconductor layer 20n and the second semiconductor layer 30p are alternately arranged. The arrangement direction of the first semiconductor layer 20n and the second semiconductor layer 30p corresponds with the x-direction. In the solar cell 1, the arrangement direction x and the long direction y are orthogonal. As illustrated in FIG. 2, in the solar cell 1, the first semiconductor layer 20n has a first conductivity type region Rn, and the second semiconductor layer 30p has a second conductivity type region Rp.

A boundary region R is located between the first conductivity type region Rn and the second conductivity type region Rp. An end 27 of the first semiconductor layer 20n in the arrangement direction x and an end 37, in the arrangement direction x, of the second semiconductor layer 30p adjacent the first semiconductor layer 20n overlap in the boundary region R. In the boundary region R, the insulating layer 40 is disposed between the end 27 of the first semiconductor layer 20n and the end 37 of the second semiconductor layer 30p. The insulating layer 40 may be made of, for example, aluminum nitride, silicon nitride, or silicon oxide.

The first electrode 50n is electrically connected to the first semiconductor layer 20n. As illustrated in FIG. 1, the first electrode 50n is formed along the long direction y. The first electrode 50n includes a first transparent electrode layer 52n and a first collection electrode 55n. The first transparent electrode layer 52n is formed on the first semiconductor layer 20n. The first transparent electrode layer 52n is also formed on the second semiconductor layer 30p formed on the insulating layer 40. The first transparent electrode layer 52n is made of an electrically conductive material having light transmitting characteristics. The first transparent electrode layer 52n may be made of, for example, indium tin oxide (ITO), stannous oxide, or zinc oxide. The first collection electrode 55n is formed on the first transparent electrode layer 52n. The first collection electrode 55n may be formed with a plating method after a base metal has been formed on the first transparent electrode layer 52n. Alternatively, the first collection electrode 55n may be formed with an electrically conductive resin paste using a resin material as the binder and electrically conductive particles, such as silver particles, as a filler, or with a sputtering method in which silver, for example, is deposited.

The second electrode 50p is electrically connected to the second semiconductor layer 30p. As illustrated in FIG. 1, the second electrode 50p is formed along the long direction y. The second electrode 50p includes a second transparent electrode layer 52p and a second collection electrode 55p. The second transparent electrode layer 52p is formed on the second semiconductor layer 30p. The second transparent electrode layer 52p is also formed on the second semiconductor layer 30p formed on the insulating layer 40. The second collection electrode 55p is formed on the second transparent electrode layer 52p. The second transparent electrode layer 52p and the second collection electrode 55p may be made of the same material as the first transparent electrode layer 52n and the first collection electrode 55n, respectively.

Note that the first transparent electrode layer 52n and the second transparent electrode layer 52p in the first electrode 50n and the second electrode 50p, respectively, are not required to be transparent; the first transparent electrode layer 52n and the second transparent electrode layer 52p may be made of a material that is not transparent.

The first electrode 50n and the second electrode 50p collect carriers. The first electrode 50n and the second electrode 50p are isolated from each other by an isolation trench 60 for preventing short circuits. The isolation trench 60 is formed along the long direction y.

As illustrated in FIG. 1, the connecting electrode 70n is electrically connected to the ends of the plurality of first electrodes 50n. The connecting electrode 70p is electrically connected to the ends of the plurality of second electrodes 50p. The connecting electrode 70n and the connecting electrode 70p collect the carriers collected by the plurality of first electrodes 50n and the plurality of second electrodes 50p, respectively.

As illustrated in FIG. 2, in this embodiment, the side of the insulating layer 40 adjacent the second conductivity type region Rp has an inclined surface 40a inclined such that the thickness of the insulating layer 40 decreases with decreasing distance from the second conductivity type region Rp. Moreover, the width W of the inclined surface 40a in a direction perpendicular to the thickness direction z and in a direction toward the second conductivity type region Rp (arrangement direction x) is 10 to 300 times the thickness T of the insulating layer 40 in a region excluding the inclined surface 40a. According to this embodiment, since the side of the insulating layer 40 adjacent to the second conductivity type region Rp has the inclined surface 40a, it is possible to prevent or reduce severance or detachment of the second transparent electrode layer 52p upon sputtering or depositing by CVD the second transparent electrode layer 52p on the inclined surface 40a.

Note that in this embodiment, the width W of the inclined surface 40a is 10 to 300 times the thickness T of the insulating layer 40, preferably 50 to 200 times the thickness T of the insulating layer 40, and more preferably 100 to 200 times the thickness T of the insulating layer 40. If the width W of the inclined surface 40a is too small, the second transparent electrode layer 52p may be more prone to severance or detachment. If the width W of the inclined surface 40a is too large, dielectric strength may decrease.

Figure 3:
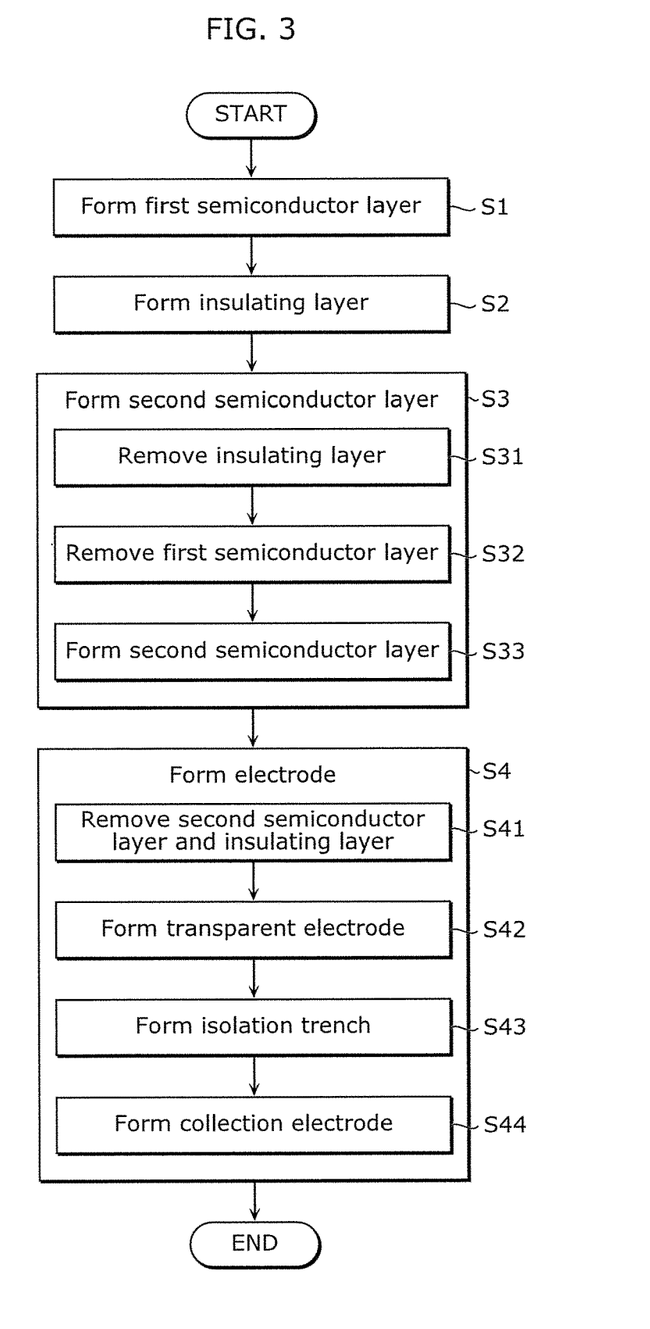
FIG. 3 is a flow chart illustrating solar cell manufacturing processes according to an embodiment.

The manufacturing method of the solar cell 1 according to this embodiment will be described with reference to FIG. 3 through FIG. 10. FIG. 3 is a flow chart for a manufacturing method of the solar cell 1 according to this embodiment. FIG. 4 through FIG. 10 are cross sectional views for illustrating a manufacturing method of the solar cell 1 according to this embodiment.

As illustrated in FIG. 3, the manufacturing method of the solar cell 1 includes Steps S1 through S4.

Step S1 is forming the first semiconductor layer 20n of the first conductivity type on the back surface 12 of the semiconductor substrate 10n of the first conductivity type. First, the semiconductor substrate 10n is prepared. In order to clean the surface of the semiconductor substrate 10n, the semiconductor substrate 10n is etched with an acid or alkali solution. The light receiving surface of the semiconductor substrate 10n is treated so as to have a texture for reducing light reflection. The back surface 12 of the semiconductor substrate 10n is more planar than the light receiving surface. The i-type amorphous semiconductor layer 22i is formed on the back surface 12 of the prepared semiconductor substrate 10n. The n-type amorphous semiconductor layer 25n is formed on the i-type amorphous semiconductor layer 22i. The i-type amorphous semiconductor layer 22i and the n-type amorphous semiconductor layer 25n are formed by, for example, CVD. In Step S1, the first semiconductor layer 20n is formed on the back surface 12.

Figure 4:
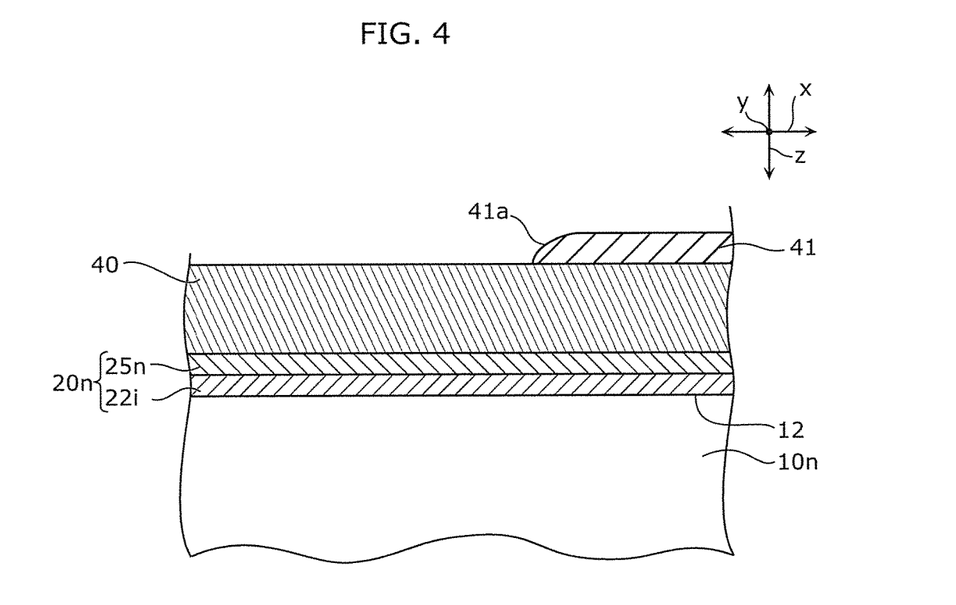
FIG. 4 is a cross sectional view for illustrating a solar cell manufacturing method according to an embodiment.

Step S2 is forming the insulating layer 40 having electrical insulating properties. The insulating layer 40 is formed on the first semiconductor layer 20n formed in Step S1. More specifically, as illustrated in FIG. 4, the insulating layer 40 is formed on the n-type amorphous semiconductor layer 25n. The insulating layer 40 is formed by, for example, CVD.

Step S3 is forming the second semiconductor layer 30p of the second conductivity type on the back surface 12 of the semiconductor substrate 10n of the first conductivity type. Step S3 includes Steps S31 through S33.

Figure 5:
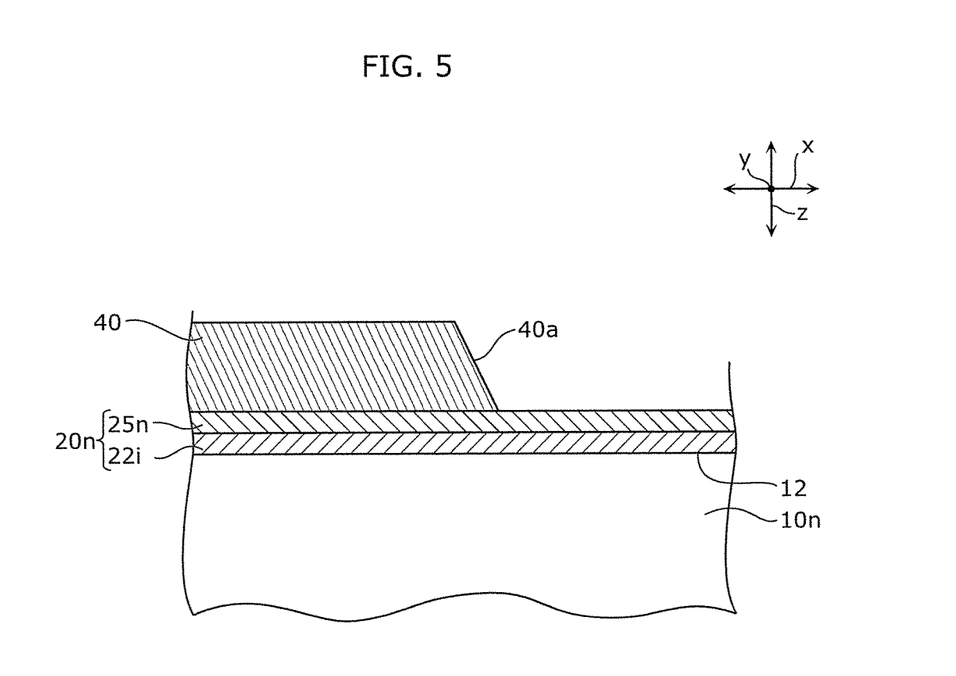
FIG. 5 is a cross sectional view for illustrating a solar cell manufacturing method according to an embodiment.

Step S31 is removing the insulating layer 40 formed on the first semiconductor layer 20n. As illustrated in FIG. 4, etching paste 41 is applied in regions in which insulating layer 40 is to be removed. Here, the edges 41a of the etching paste 41 are inclined such that the thickness of the etching paste 41 gradually decreases. By inclining the edges 41a of the etching paste 41, the inclined surface 40a can be formed on the insulating layer 40, as illustrated in FIG. 5.

In this embodiment, the inclined surface 40a is formed on the insulating layer 40 by removing some of insulating layer 40 using etching paste 41, but the method of forming the inclined surface 40a is not limited to this example. For example, some of the insulating layer 40 may be removed by patterning using a resist to form the inclined surface 40a on the insulating layer 40. The inclined surface 40a may be formed on the insulating layer 40 using other methods as well.

Figure 6:
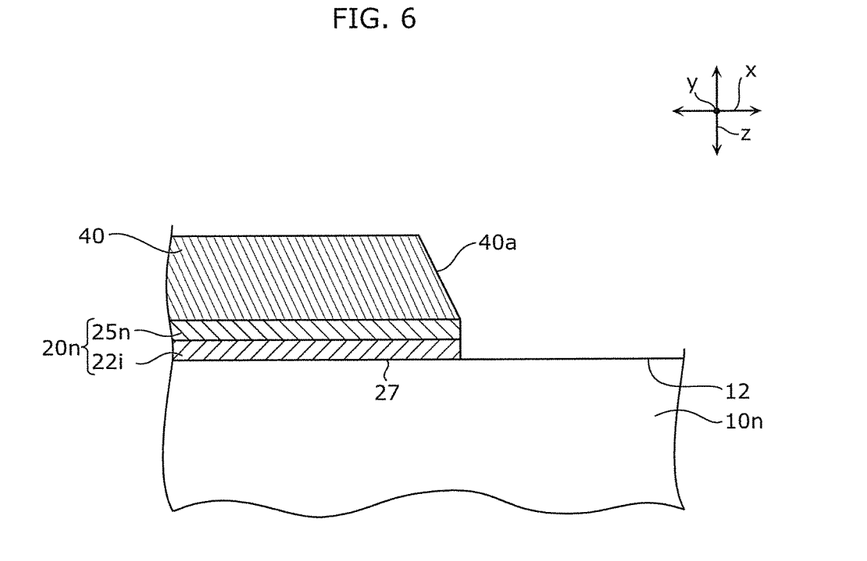
FIG. 6 is a cross sectional view for illustrating a solar cell manufacturing method according to an embodiment.

Step S32 is removing the portions of the first semiconductor layer 20n exposed after the removal of the insulating layer 40. The exposed first semiconductor layer 20n is alkali washed. As a result, the semiconductor substrate 10n is exposed, as illustrated in FIG. 6.

In Step S32, the remaining portions of the insulating layer 40 that have not been removed function as a protective layer that protects the first semiconductor layer 20n.

Figure 7:
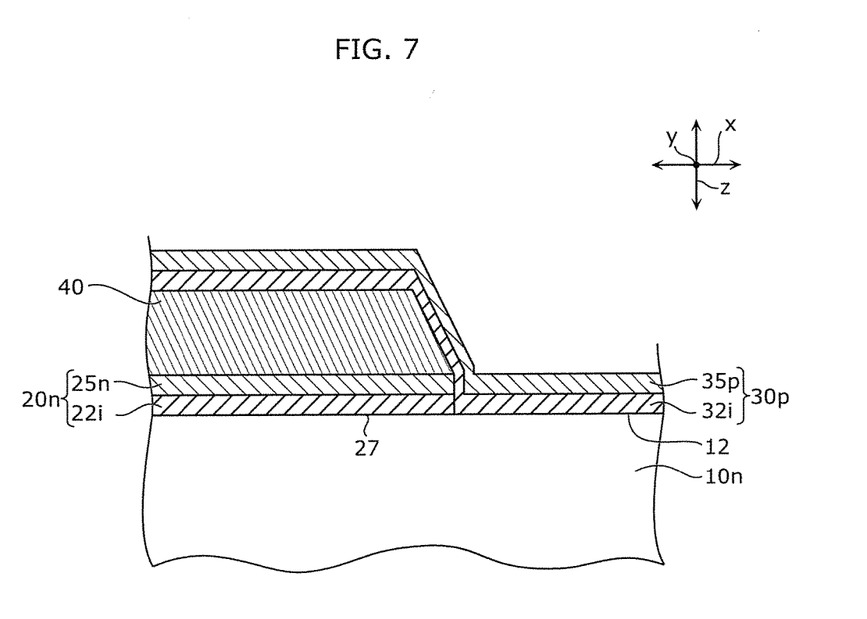
FIG. 7 is a cross sectional view for illustrating a solar cell manufacturing method according to an embodiment.

Step S33 is forming the second semiconductor layer 30p on the semiconductor substrate 10n exposed as a result of removing the first semiconductor layer 20n. The i-type amorphous semiconductor layer 32i is formed on the back surface 12 of the semiconductor substrate 10n. The p-type amorphous semiconductor layer 35p is formed on the i-type amorphous semiconductor layer 32i. The i-type amorphous semiconductor layer 32i and the p-type amorphous semiconductor layer 35p are formed by, for example, CVD. As a result of Step S22, the second semiconductor layer 30p is formed on the back surface 12. As illustrated in FIG. 7, in the solar cell 1, the second semiconductor layer 30p is formed across the entire surface. Thus, the second semiconductor layer 30p is formed on the insulating layer 40 in addition to on the back surface 12.

Step S4 is forming the first electrode 50n and the second electrode 50p. Step S4 includes Steps S41 through S44.

Figure 8:
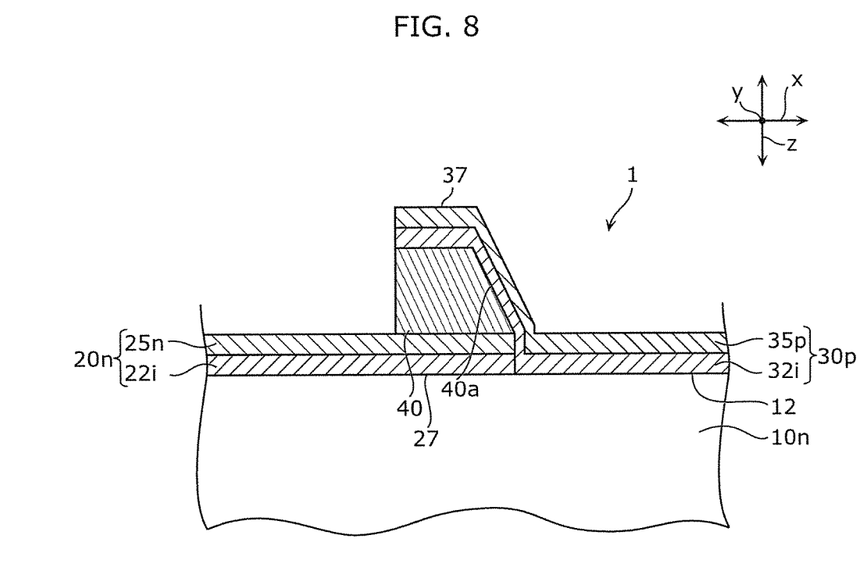
FIG. 8 is a cross sectional view for illustrating a solar cell manufacturing method according to an embodiment.

Step S41 is removing the second semiconductor layer 30p and the insulating layer 40. Resist is applied using a photolithography or screen printing method on the second semiconductor layer 30p formed on the insulating layer 40, on portions of the second semiconductor layer 30p that are to remain. Then, after using an etching liquid, portions of the second semiconductor layer 30p and the insulating layer 40 on which resist was applied remain, as illustrated in FIG. 8. Portions of the second semiconductor layer 30p and the insulating layer 40 on which resist was not applied are removed. When the insulating layer 40 is not completely removed and some of the insulating layer 40 remains, cleaning may be performed using hydrogen fluoride (HF). This exposes the first semiconductor layer 20n. Note that the second semiconductor layer 30p and the insulating layer 40 may be removed independently. Moreover, similar to Step S31, the second semiconductor layer 30p and the insulating layer 40 may be removed using a method other than one that uses resist.

Figure 9:
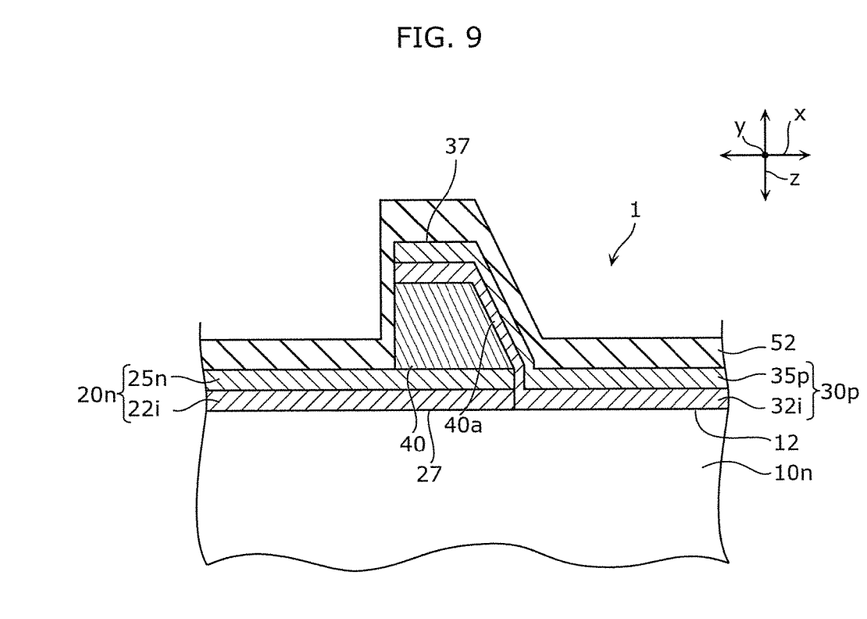
FIG. 9 is a cross sectional view for illustrating a solar cell manufacturing method according to an embodiment.

Step S42 is forming a transparent electrode layer 52. As illustrated in FIG. 9, the transparent electrode layer 52 is formed on the first semiconductor layer 20n and the second semiconductor layer 30p using a physical vapor deposition (PVD) method. Since the insulating layer 40 has the inclined surface 40a, the second semiconductor layer 30p formed on the inclined surface 40a also has an inclined surface corresponding to the inclined surface 40a. As such, the transparent electrode layer 52 formed on the second semiconductor layer 30p is formed along the inclined surface of the second semiconductor layer 30p. As a result, severing or detachment of the transparent electrode layer 52 caused by the side surface of the insulating layer 40 can be prevented or reduced.

Afterward, in the present embodiment, a base metal layer to function as the base for the first collection electrode 55n and the second collection electrode 55p is formed using a physical vapor deposition (PVD) method. Examples of the base metal include Ti and Cu.

Figure 10:
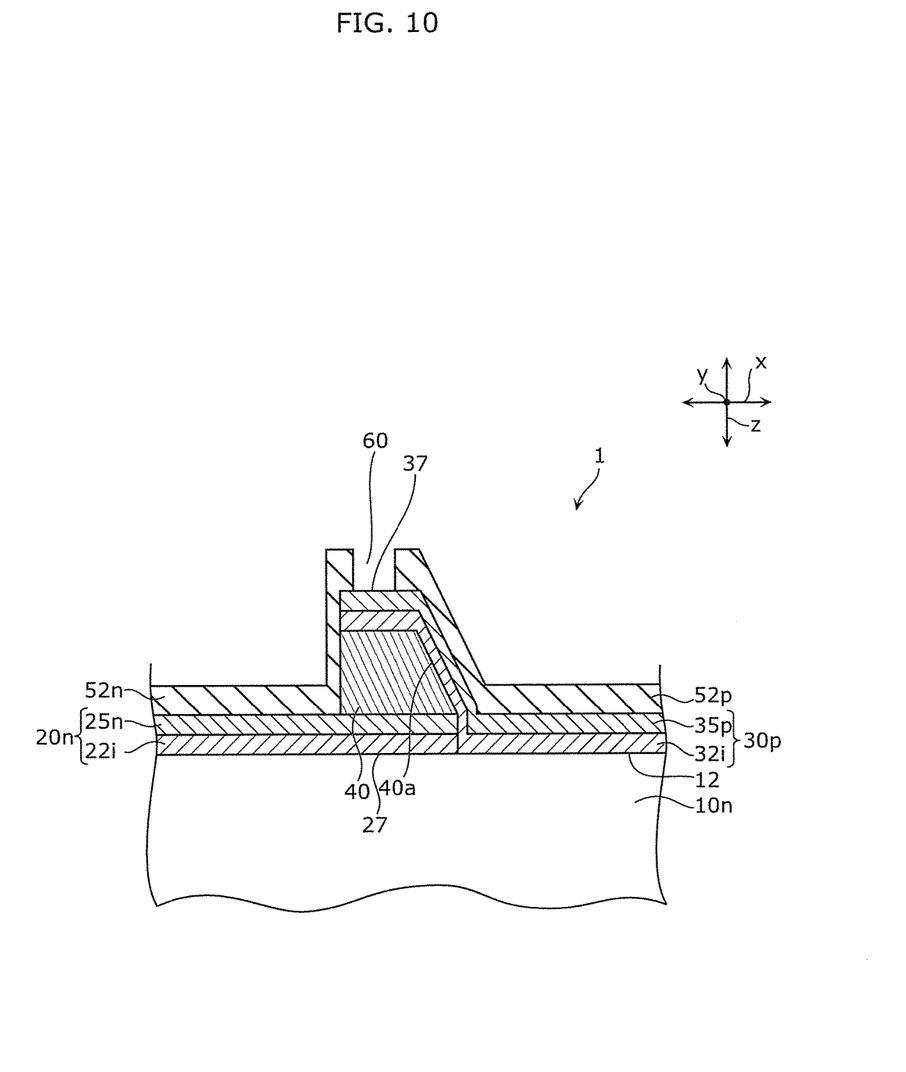
FIG. 10 is a cross sectional view for illustrating a solar cell manufacturing method according to an embodiment.

Step S43 is forming the isolation trench 60 for preventing short circuits. The isolation trench 60 is formed using a laser. As illustrated in FIG. 10, forming the isolation trench 60 divides the transparent electrode layer 52 into a first transparent electrode layer 52n and a second transparent electrode layer 52p. In this embodiment, the isolation trench 60 is formed using a laser, but the isolation trench 60 may be formed using, for example, a resist and an etching liquid.

Step S44 is forming the first collection electrode 55n and the second collection electrode 55p. The first collection electrode 55n and the second collection electrode 55p are formed on the first transparent electrode layer 52n and the second transparent electrode layer 52p, respectively, using a plating method. Note that the first collection electrode 55n and the second collection electrode 55p may be formed using a screen printing method in which an electrically conductive paste is applied and then sintered.

The solar cell 1 illustrated in FIG. 2 can thus be manufactured as described above.

In the above embodiment, the semiconductor substrate 10n is exemplified as being of a first conductivity type—that is to say, is exemplified as an n-type semiconductor substrate, but the semiconductor substrate 10n may be of a second conductivity type—that is to say, may be a p-type semiconductor substrate.

In the above embodiment, the first semiconductor layer 20n includes the i-type amorphous semiconductor layer 22i and the n-type amorphous semiconductor layer 25n, but the first semiconductor layer 20n may be composed of the n-type amorphous semiconductor layer 25n only. Similarly, the second semiconductor layer 30p may be composed of the p-type amorphous semiconductor layer 35p only.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell, comprising:
a semiconductor substrate of one of a first conductivity type and a second conductivity type having a light receiving surface and a back surface;
a first semiconductor layer of the first conductivity type on the back surface;
a second semiconductor layer of the second conductivity type on the back surface;
a first electrode electrically connected to the first semiconductor layer;
a second electrode electrically connected to the second semiconductor layer; and
an insulating layer in a boundary region between a first conductivity type region of the first semiconductor layer and a second conductivity type region of the second semiconductor layer,
wherein
a side of the insulating layer adjacent the second conductivity type region has an inclined surface inclined such that a thickness of the insulating layer decreases with decreasing distance from the second conductivity type region, and a width of the inclined surface in a direction perpendicular to a thickness direction of the insulating layer and toward the second conductivity type region is 10 to 300 times a thickness of the insulating layer in a region excluding the inclined surface,
in the boundary region, the first semiconductor layer is in a direct contact with the back surface of the semiconductor substrate and the insulating layer is between the first semiconductor layer and the second semiconductor layer in a direction orthogonal to the back surface of the semiconductor substrate,
the first electrode comprises: a first transparent electrode layer; and a first collection electrode layer on the first transparent electrode layer,
the second electrode comprises: a second transparent electrode layer; and a second collection electrode layer on the second transparent electrode layer, and
the second semiconductor layer and the second transparent electrode layer are stacked on the inclined surface of the insulating layer, according to an order of: the insulating layer, the second semiconductor layer, and the second transparent electrode layer, each of the second semiconductor layer and the second transparent electrode layer extending parallel to the inclined surface of the insulating layer.

2. The solar cell according to claim 1, wherein in the boundary region, the second transparent electrode layer is on the second semiconductor layer in the direction orthogonal to the back surface of the semiconductor substrate.

3. The solar cell according to claim 1, wherein in a region in which the inclined surface is formed, the insulating layer is between the first semiconductor layer and the second semiconductor layer in the direction orthogonal to the back surface of the semiconductor substrate.

4. The solar cell according to claim 1, wherein a side surface of the insulating layer adjacent the first conductivity type region is perpendicular to the back surface of the semiconductor substrate.

* * * * *